Jan. 7, 1969 JAMES E. WEBB 3,420,704
ADMINISTRATOR OF THE NATIONAL AERONAUTICS
AND SPACE ADMINISTRATION
DEPOSITING SEMICONDUCTOR FILMS UTILIZING A THERMAL GRADIENT
Filed Aug. 19, 1966
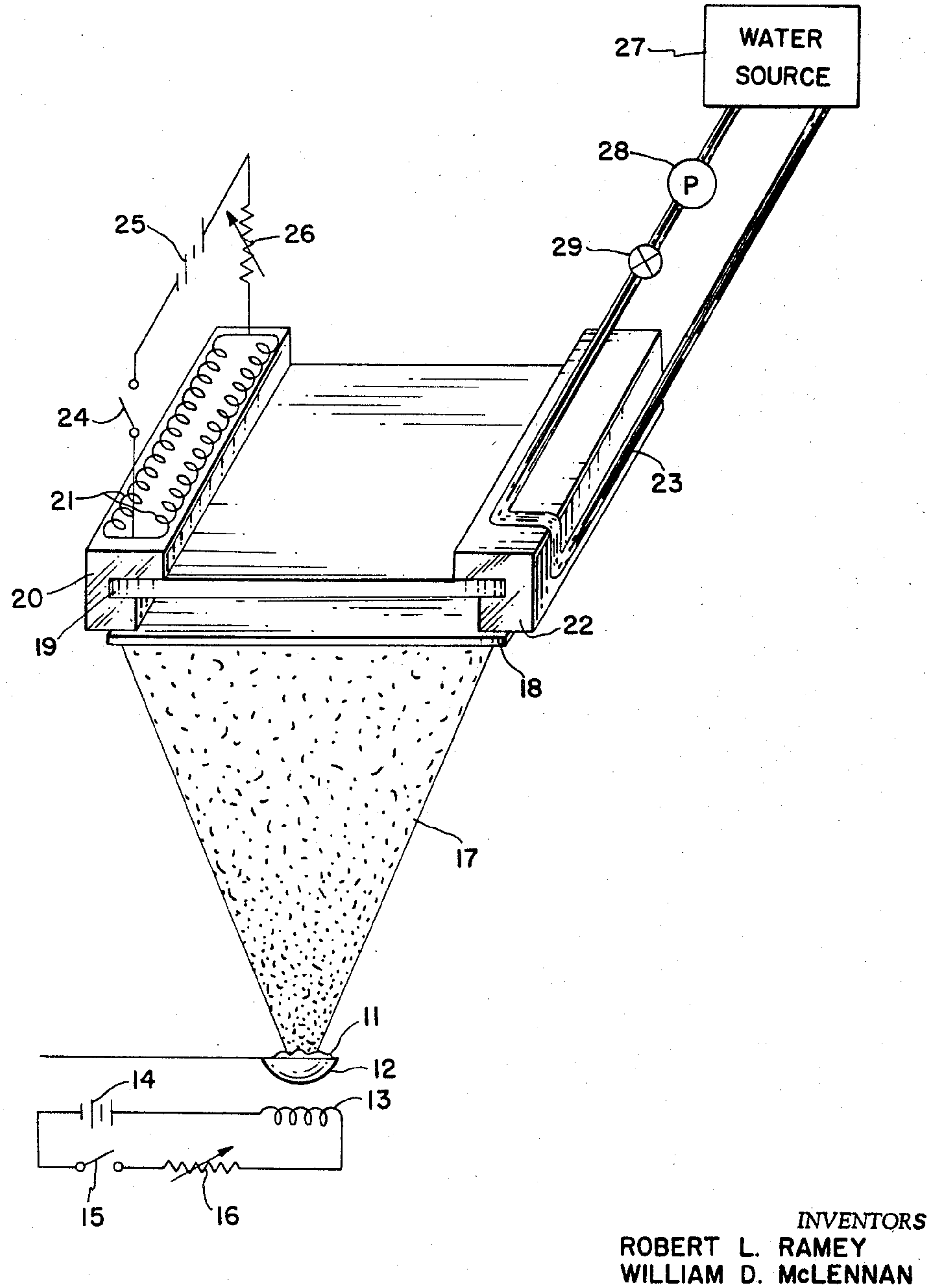
INVENTORS
ROBERT L. RAMEY
WILLIAM D. McLENNAN
BY
William H. King
ATTORNEYS United States Patent Office 3,420,704

Patented Jan. 7, 1969

3,420,704

DEPOSITING SEMICONDUCTOR FILMS UTILIZING A THERMAL GRADIENT

James E. Webb, Administrator of the National Aeronautics and Space Administration with respect to an invention of Robert L. Ramey, Charlottesville, and William D. McLennan, Richmond, Va.

Filed Aug. 19, 1966, Ser. No. 574,280

U.S. Cl. 117—201 2 Claims

Int. Cl. C23c *13/04*

ABSTRACT OF THE DISCLOSURE

A process for increasing the hole mobility of deposited semiconductor material film on a substrate is provided by depositing in a vacuum a polycrystalline semiconducting film such as germanium onto a substrate while maintaining a thermal gradient across the substrate.

The invention described herein was made in the performance of work under a NASA contract and is subject to the provision of Sections 305 of the National Aeronautics and Space Act of 1958, Public Law 85–568 (72 STAT. 435; 42 U.S.C. 4257).

The invention relates generally to a method for vacuum depositing semiconducting films and more specifically concerns a method for increasing the charge carrier mobility of vacuum deposited semiconducting films by the use of a thermal gradient across the substrate during deposition.

The vacuum deposition of both single crystal and polycrystalline thin films is of growing importance in the fields of microcircuit production and in the development of electronic devices such as the field effect transistor. The electrical conductivity of a film is directly proportional to the mobility of the electrons or holes which constitute the electric current. The hole mobility of bulk, single crystal germanium is 1800 cm.$^2$/volt-second whereas a polycrystalline germanium film several thousand angstroms thick may have a mobility on the order 20 cm.$^2$/volt-second. Efforts are being made to increase the mobility of the electrons or holes in thin films. The invention described herein presents one successful effort in this direction.

The art of vacuum depositing thin polycrystalline and amorphous films of conductors, semiconductors, and insulators is well known and highly developed. Polycrystalline semiconducting films are usually characterized by being p-type films with a relatively low hole mobility. For example, if a substrate upon which the film is to be deposited is at 300° C. and under isothermal conditions, typical values for hole mobility run between 8 and 25 cm.$^2$/volt-second.

The invention presented in this application is simply the use of a thermal gradient across the surface of the substrate during the vacuum deposition of the film to increase the hole mobility. As an example, if the mean substrate temperature is 300° C. and a thermal gradient of 280° C./cm. is established across the substrate, the hole mobility range is 55 to 70 cm.$^2$/volt-second. If the mean substrate temperature is increased to 500° C. and the thermal gradient is 280° C./cm., then the hole mobility range is 140 to 160 cm.$^2$/volt-second.

The single figure in this application is a schematic drawing of the apparatus used in carrying out the method which constitutes the invention.

In describing the invention, specific terminology will be resorted to for the sake of clarity. However, it is not intended to be limited to this specific term so selected, and it is to be understood that each specific term includes all technical equivalents which operate in a similar manner to accomplish a similar purpose.

Turning now to the drawing, the structure needed to carry out the method that constitutes this invention will be described. Germanium 11 or any other semiconducting material is placed in a boat 12 which is heated by electron bombardment from a filament 13. Filament 13 is connected across a voltage source 14, a switch 15 and a variable resistor 16 that are connected in series. Variable resistor 16 is used to control the heat generated by filament 13. When boat 12 is heated, a molecular beam 17 of germanium passes through a mask 18 and deposits on a substrate 19. During deposition the germanium molecules will tend to move about on the substrate surface to some extent as they accommodate their energy to that of the surface. A thermal gradient is established across the surface of substrate 19 by the means of a carbon block heat source 20 heated by filaments 21 and a carbon block heat sink 22 which is cooled by a water line 23. Filaments 21 are connected across a switch 24, a voltage source 25 and a variable resistor 26 that are connected in series. Variable resistor 26 is used to control the amount of heat generated by the filaments 21. Water line 23 is supplied from a water source 27 by means of a pump 28 under the control of a valve 29.

This invention consists simply of the method of evaporating a semiconductor material 11, depositing this evaporated material on substrate 19 and creating a thermal gradient across substrate 19 while the semiconducting material is being deposited. Apparently the presence of this thermal gradient permits the deposited molecules to migrate on the substrate surface in a manner which results in enhanced crystallite growth. Without the thermal gradient, electron diffraction studies indicate extremely small crystal-like formations. The use of the thermal gradient yields a relatively uniform crystallite formation in the range of 1000 to 2000° A. in diameter as indicated by electron diffraction and electron microscope studies.

What is claimed is:

1. A method of vacuum depositing semiconducting films on a substrate comprising the steps of:

evaporating a polycrystalline semiconducting material;

depositing said evaporated material on said substrate; and creating a thermal gradient across said substrate while said polycrystalline material is being deposited whereby said thermal gradient increases the hole mobility of the deposited material.

2. A method as described in claim 1 wherein said thermal gradient across said substrate is produced by simultaneously heating one end of said substrate and cooling the other end of said substrate.

References Cited

UNITED STATES PATENTS 3,160,522 12/1944 Heywang et al. ------ 117—229

3,335,038 8/1967 Doo --------------- 140—175

ALFRED L. LEAVITT, *Primary Examiner.*

A. GOLIAN, *Assistant Examiner.*

U.S. Cl. X.R.

117—106, 107